US 11,143,704 B2

(12) United States Patent
Craig

(10) Patent No.: US 11,143,704 B2
(45) Date of Patent: Oct. 12, 2021

(54) POWER GENERATION SYSTEM TEST APPARATUS AND METHOD

(71) Applicant: One Step Power Solutions, Inc., Houston, TX (US)

(72) Inventor: Mark Craig, Houston, TX (US)

(73) Assignee: One Step Power Solutions, Inc., Houston, TX (US)

(*) Notice: Subject to any disclaimer, the term of this patent is extended or adjusted under 35 U.S.C. 154(b) by 194 days.

(21) Appl. No.: 16/405,337

(22) Filed: May 7, 2019

(65) Prior Publication Data

US 2019/0257884 A1     Aug. 22, 2019

Related U.S. Application Data

(63) Continuation of application No. PCT/US2017/060093, filed on Nov. 6, 2017.

(60) Provisional application No. 62/424,575, filed on Nov. 21, 2016.

(51) Int. Cl.
*G01R 31/34* (2020.01)
*G01R 31/42* (2006.01)

(52) U.S. Cl.
CPC .......... *G01R 31/343* (2013.01); *G01R 31/42* (2013.01)

(58) Field of Classification Search
CPC ...... G01R 31/34; G01R 31/343; G01R 31/42; G01R 21/06; G01R 19/14; G01R 19/145; G01R 15/14; G01R 15/146; G01R 15/12
See application file for complete search history.

(56) References Cited

U.S. PATENT DOCUMENTS

| | | | |
|---|---|---|---|
| 5,486,751 A * | 1/1996 | Koenig | H02P 9/30 322/86 |
| 6,545,456 B1 | 4/2003 | Radosevich et al. | |
| 7,688,040 B2 | 3/2010 | Basic et al. | |
| 7,966,101 B2 | 6/2011 | Mitani et al. | |
| 8,823,208 B2 | 9/2014 | Bekiarov | |
| 9,013,060 B2 | 4/2015 | Katru et al. | |
| 2016/0006338 A1 * | 1/2016 | Sakimoto | H02P 9/105 363/131 |
| 2018/0131302 A1 * | 5/2018 | Frampton | H02P 9/00 |
| 2019/0204390 A1 * | 7/2019 | Krishnamoorthi | G01R 31/343 |

OTHER PUBLICATIONS

International Search Report and Written Opinion, International Application No. PCT/US2017/060093 dated Feb. 2, 2018.
Written Opinion, Singapore Application No. 11201904335X dated Nov. 4, 2019.
Letter from Intellectual Property Office of Singapore, Singapore Application No. 11201904335X dated Nov. 29, 2019.

* cited by examiner

*Primary Examiner* — Son T Le
(74) *Attorney, Agent, or Firm* — Richard A. Fagin

(57) ABSTRACT

A method for testing a power generation system includes measuring current generated by a generator comprising a field winding operable to control current generated by the generator by controlling current applied to the field winding. Voltage output by the generator is measured. The measured current and the measured voltage are conducted to a processor connected to the generator. The processor to varies at least one of the measured current and the measured voltage. A field output of the processor is coupled to the field winding of the generator. A response of the power generation system to the varied measured current or measured voltage is determined.

19 Claims, 2 Drawing Sheets

POWER GENERATION SYSTEM TEST APPARATUS AND METHOD

CROSS REFERENCE TO RELATED APPLICATIONS

Continuation of International Application No. PCT/US2017/060093 filed on Nov. 6, 2017. Priority is claimed from U.S. Provisional Application No. 62/424,575 filed on Nov. 21, 2016. Both the foregoing applications are incorporated herein by reference in their entirety.

STATEMENT REGARDING FEDERALLY SPONSORED RESEARCH OR DEVELOPMENT

Not Applicable

NAMES OF THE PARTIES TO A JOINT RESEARCH AGREEMENT

Not Applicable.

BACKGROUND

This disclosure relates to the field of electric power generators. More specifically, the disclosure relates to test devices for electric power generators and power generation and distribution systems.

Electric power generators and generator systems include DC and/or AC generators, either individually or a plurality thereof connected to a power distribution and load system, wherein the load may comprise any device or combination of devices that convert electric power from the generator(s) into useful work such as light, heat, rotational or other kinetic energy and electrochemical energy, among other types of useful work.

Such generators and systems may be subject to faults, for example, failures of some of the field or stator windings in an AC generator, short circuits on the power distribution system, and failure (partial or total) of components of voltage and current regulation devices to maintain the system voltages as load changes during use of the system, among other faults. It is therefore desirable to have a system which can test an entire power generation and distribution system with minimal intrusiveness.

U.S. Pat. No. 7,218,122 issued to Nastasi et al. discloses an apparatus that selectively generates a disturbance in a three-phase supply voltage provided to a load. The apparatus includes input connections for receiving a first phase voltage, a second phase voltage and a third phase voltage of the three-phase supply voltage. The apparatus includes a voltage disturbance generator for selectively adjusting the amplitudes of the first, second and third phase voltages according to a first test method, a second test method or a third test method. Output connections are provided for connecting to the load to provide the load the first, second and third phase voltages as altered according to the first, second or third test method. In the first test method, a phase-to-phase voltage disturbance is introduced between the first and second phase voltages by altering the amplitude of the first phase voltage against the second phase voltage. In the second test method, a phase-to-phase voltage disturbance is introduced between the first and second phase voltages by altering the amplitudes of the first and second phase voltages in reference to each other. In the third test method, a phase-to-phase voltage disturbance is introduced between the first and second phase voltages by altering the amplitude of the first and second phase voltages in reference to a neutral connection. The apparatus provides for selecting the first, second or third test method without disconnecting any of the first, second and third phase voltages from the input connections, without disconnecting the load from any of the output connections, and without interrupting the load.

The device disclosed in the Nastasi et al. patent is designed for three phase generators, and does not necessarily test the response of the load system to induced disturbances. There continues to be a need for test apparatus for other types of generators, multiple generator systems and power distribution and load systems.

SUMMARY

A method for testing a power generation system according to one aspect of the present disclosure includes measuring current generated by a generator comprising a field winding operable to control current generated by the generator by controlling current applied to the field winding. Voltage output by the generator is measured. The measured current and the measured voltage are conducted to a processor connected to the generator. The processor to varies at least one of the measured current and the measured voltage. A field output of the processor is coupled to the field winding of the generator. A response of the power generation system to the varied measured current or measured voltage is determined.

In some embodiments, the varied measured current or the varied measured voltage enables testing the power generation system response to at least one of voltage dip ride-through, over voltage, under voltage, over excitation of the field winding, under excitation of the field winding, kilovolt-ampere reactive (kVAR) sharing failure, voltage sensing failure and governor stability protection.

In some embodiments the current measurement is made by an inductive or Hall effect or shunt sensor.

In some embodiments the voltage measurement is made by a respective transformer coupled to a power output of the at least one generator.

In some embodiments the processor is in signal communication with a corresponding processor associated with each of a plurality of generators, the signal communication causing each processor to perform either the same variation of the measured current and measured voltage or a different variation of each of the plurality of generators.

A power generation system test apparatus according to another aspect of the present disclosure includes a test apparatus coupled to each one of a plurality of electric generators in the power generation system. A current sensor is coupled to an output of each generator. An output of each current sensor is coupled to a current signal input of the test apparatus. The test apparatus comprises a voltage sensor coupled to an output of each generator and a processor in signal communication with the current sensor and the voltage sensor. The processor has a signal output conducted to inputs of an automatic voltage regulator. The test apparatus also comprises a signal input to the processor coupled to respective outputs of the automatic voltage regulator and a signal output coupled to a field winding of the generator. The processor is programmed to cause variations in the current applied to the field winding and to measure response of the generator to the variations.

In some embodiments each of the plurality of test apparatus comprises a communication module in signal communication with the respective processor, whereby the variations in the applied current are the same for each of the plurality of generators.

In some embodiments the current sensor comprises an inductive, Hall effect or shunt sensor.

In some embodiments the voltage sensor comprises a voltage transformer.

In some embodiments the variations are configured to measure power generation system response to at least one of voltage dip ride-through, over voltage, under voltage, over excitation of the field winding, under excitation of the field winding, kilovolt-ampere reactive (kVAR) sharing failure, voltage sensing failure and governor stability protection.

DETAILED DESCRIPTION

Figure 1:
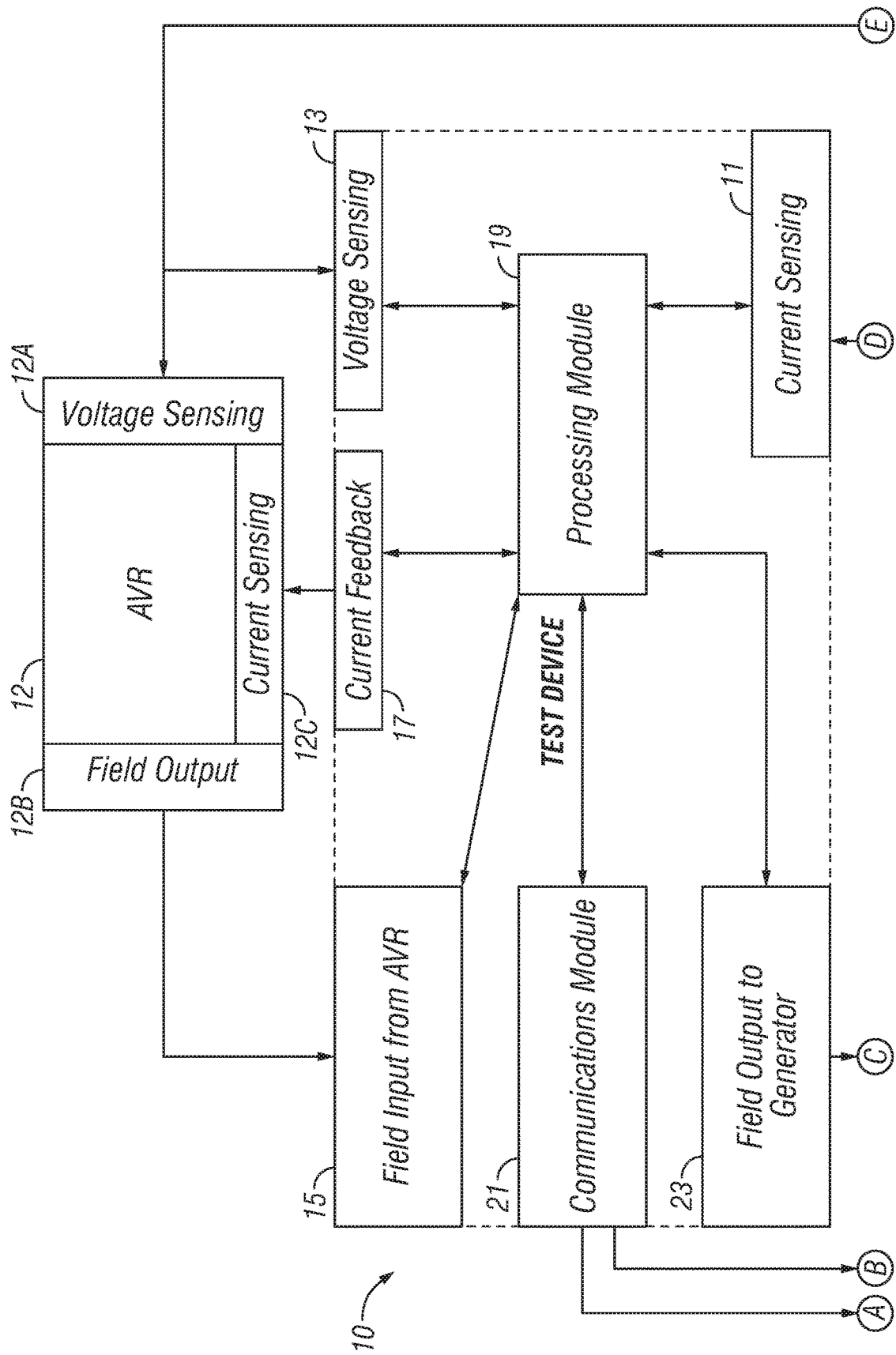
FIG. 1 shows an example generator test device according to the present disclosure connected to a generator for testing.
Figure 1:
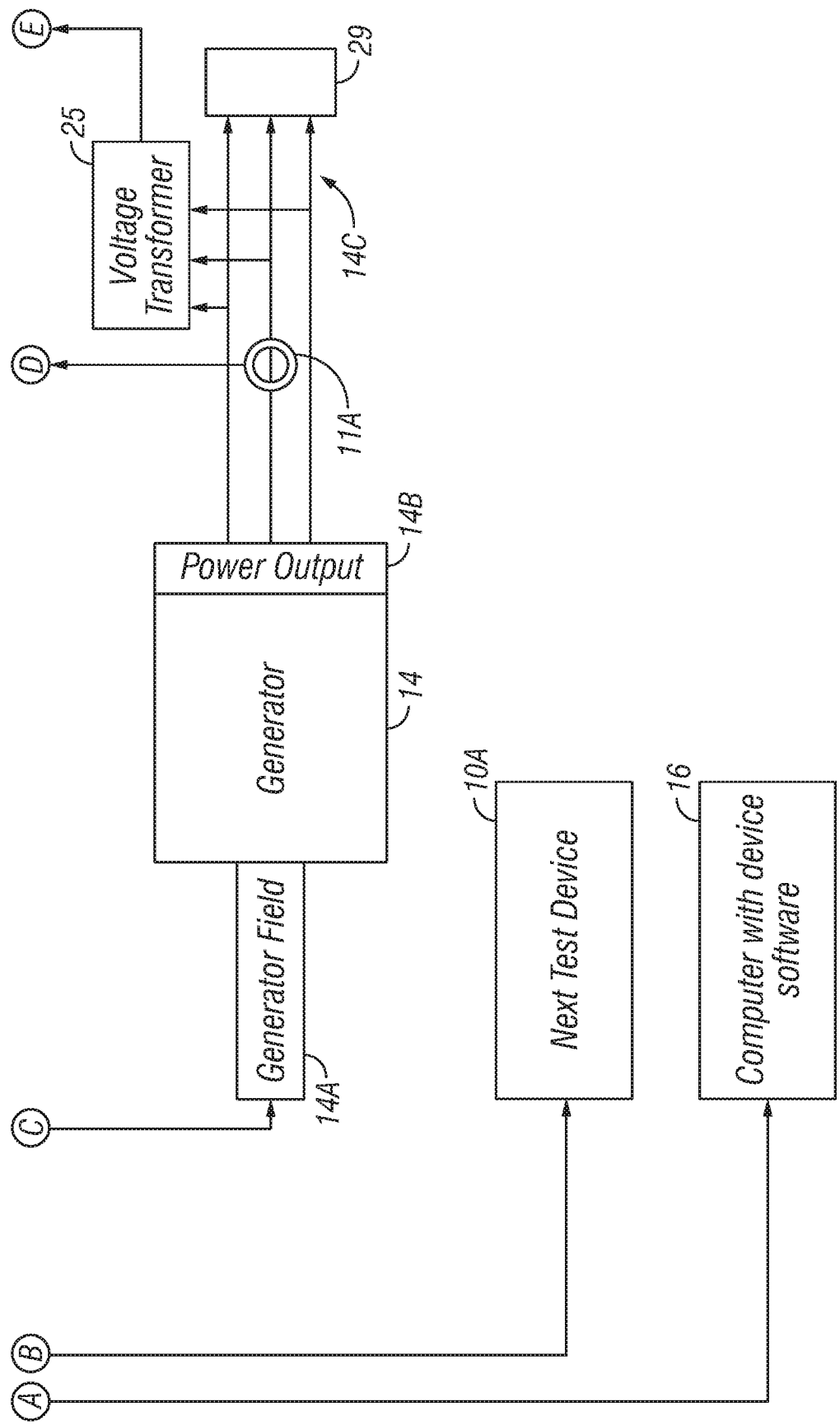

A generator test device according to the present disclosure may simulate the effects of voltage disturbances on a power generation and distribution system, and to detect and record the power generation and distribution system responses to those disturbances.

The generator test device may induce voltage disturbances into the power generation and distributions system by imparting controlled currents into the field windings of the generators of the power generation portion of the power generation and distribution system. The generators may be, for example, commutated field DC generators or continuous-connection field alternators (AC generators). Imparting current into the generator field windings may be obtained by disconnecting automatic voltage regulator (AVR) field outputs from the generator field winding connections and then connecting the AVR field outputs to the AVR field input of the generator test device. The generator field windings are then connected to the field output of the test device.

The generator test device may have voltage and current sensing capabilities to be used for both closed loop control of the generation system and data capture for system response verification. It should be noted that not all generator systems have current feedback control, therefore the test device may have both a current feedback implementation and a no current feedback implementation.

As some electric power generation systems comprise multiple generators, control of a single AVR and generator using the test device may not be sufficient for complete power generating and distribution system testing requirements. Also it is desirable to record/recover the data that is generated by the generator test device, and so for this reason the generator test device may be equipped with a communications module. The communications module may comprise a high speed data communications link that will include both synchronizing/clock signals as well as data communication capability for generator test device control and feedback.

A partial but not comprehensive list of tests that may be possible by use of the generator test device include:
Voltage Dip Ride-through
Over Voltage
Under Voltage
Over excitation
Under excitation
kVAR (kilovolt-ampere reactive) sharing failure
Voltage sensing failure
Governor stability protection (PQ limits etc.)

Various modules in the generator test device are described below with reference to the functions performed by each module in the example embodiment of a generator test device shown at 10 in FIG. 1.

The generator 14 being tested may be connected at its output terminals 14C to the same load 29 (which may comprise any combination of power distribution and power-using devices) as it would be in ordinary use of the generator 14. The generator test device 10 may comprise a current sensor 11. In the present embodiment, the current sensor 11 may be an inductive or Hall effect sensor 11A disposed about or proximate one of the power output terminals 14C of a generator 14. Other embodiments may use a shunt/voltage sensor to measure current. The current sensor 11 may be in signal communication with a test device processor 19. The test device processor 19 may be a programmable microcomputer, application specific integrated circuit, field programmable gate array, programmable logic controller (PLC) or any other similar processor. A voltage transformer 25 may be coupled to the generator output 14B, 14C to provide a selected voltage as input to a voltage sensor 13 in the generator test device 10. The voltage sensor 13 may also be in signal communication with the test device processor 19. The voltage sensor 19 may be electrically connected to the voltage sensing input 12A of an automatic voltage regulator (AVR) 12 associated with the generator 14. A current sensing input 12C for AVRs with current feedback capability may be in signal communication with a current feedback element 17 in the generator test device 10. The current feedback element 17 may also be in signal communication with the test device processor 19.

A field output 12B from the AVR 12 may be electrically connected to a field control input 15 in the test device 10. The field control input 15 may be in signal communication with the test device processor 19.

The system processor 19 generates specifically configured output control signals for operating the generator 14 in various test modes, described further below. The output control signals may be conducted to a power amplifier or current control device, shown as field output 23 connected to the field windings 14A of the generator 14 in FIG. 1.

The field input 15 may both measure the current being injected by the field input 15 and sink (consume) this current to ensure the AVR 12 does not operate any internal protection mechanisms resident on the AVR 12.

The generator field output 23 will output the nominal current that would otherwise be generated by the AVR 14 when not testing, and the calculated test current during a test. The output of the generator field output 23 may be controlled by the test device processor 19 as explained above.

The voltage sensor 13 will measure the voltage that the generator 14 is currently producing and conduct the measured voltage values back into the test device processor 19.

When testing a system that has current feedback capability the current sensor 11 will measure the current that the generator 14 is currently producing and conduct the measured current values back into the processor 19.

When testing a system that has current feedback capability the current feedback element 17 will generate a current to feed back into the current sensing input 12C of the AVR 12. The current feedback value will be equal to the current that is being produced by the generator 14 when not running a test and a calculated value during a test. This output will be controlled by the test device processor 19.

A communications module 21 may communicate with one or more additional generator test devices (e.g., at 10A)

configured similarly to the generator test device 10 shown in FIG. 1 that are currently in use and a main control program will operate on a computer 16 that is being used to control the tests. The communications protocol used by the communication module 21 may operate at sub-cycle speeds to allow accurate synchronization and high speed data recording.

The test device processor 19 may be programmed to perform the following tasks:
Coordinate all internal device communications
Set the output limits of the voltage and current outputs
Record and format the voltage and current inputs
Control communications with the communications module
Coordinate all timing and synchronisation with computer control software Test device control software programmed or stored on the computer 16 may provide that the same test protocol will be performed on all generator test devices (e.g., at 10 and 10A) in signal communication with the computer 16. The software program will perform all calculations and distribute all control values required by the generator test devices being concurrently used. The software stored on or accessed by the computer 16 may also cause the computer 16 to record and produce both graphs and numeric data records for analysis.

Although only a few examples have been described in detail above, those skilled in the art will readily appreciate that many modifications are possible in the examples. Accordingly, all such modifications are intended to be included within the scope of this disclosure as defined in the following claims.

What is claimed is:

1. A method for testing a power generation system, comprising:
   using a test device, measuring current generated by at least one generator comprising a field winding operable to control voltage generated by the at least one generator by controlling voltage applied to the field winding, an output of the at least one generator connected to a load;
   using the test device, measuring voltage output by the at least one generator;
   selectively conducting the measured current and the measured voltage to a test device processor connected to the at least one generator;
   causing the test device processor to vary at least one of output current and the output voltage by generating a field output current and/or voltage that varies in a test mode independently of the measured voltage output and measured current; and
   selectively conducting the field output current and/or voltage of the test device processor to the field winding of the at least one generator; and
   determining a response of the power generation system to the varied current and/or voltage outputted to the field windings of the least one generator.

2. The method of claim 1 wherein the varied output current or the varied output voltage enables testing the power generation system response to at least one of voltage dip ride-through, over voltage, under voltage, over excitation of the field winding, under excitation of the field winding, kilovolt-ampere reactive (kVAR) sharing failure, voltage sensing failure and governor stability protection.

3. The method of claim 1 wherein the measuring generated current measurement is performed by an inductive sensor, a Hall effect sensor, or a shunt sensor.

4. The method of claim 1 wherein the voltage measurement is made by a respective transformer coupled to a power output of the at least one generator.

5. The method of claim 1 wherein the processor is in signal communication with a corresponding processor associated with each of a plurality of generators, the signal communication causing each processor to perform either the same variation of the measured current and measured voltage or a different variation of each of the plurality of generators.

6. The method of claim 1 further comprising electrically disposing the test device between the at least one generator and an automatic voltage regulator of the at least one generator.

7. The method of claim 6 wherein the test device is a stand-alone test device that is separate from the at least one generator and the automatic voltage regulator.

8. The method of claim 1 wherein measuring current generated by the at least one generator includes electrically connecting a current sensor of the test device to the field winding of the at least one generator.

9. The method of claim 1 wherein measuring voltage output by the at least one generator includes electrically connecting a voltage sensor of the test device to a voltage transformer of the at least one generator.

10. A power generation system test apparatus, comprising:
    a test apparatus selectively coupled to each one of a plurality of electric generators in the power generation system, a current sensor coupled to an output of each generator, an output of each current sensor coupled to a current signal input of the test apparatus, the test apparatus comprising a voltage sensor coupled to an output of each generator, the test apparatus comprising a processor in signal communication with the current sensor and the voltage sensor, the processor having a signal output selectively conducted to inputs of an automatic voltage regulator;
    wherein the test apparatus comprises a signal input to the processor selectively coupled to respective outputs of the automatic voltage regulator and a signal output selectively coupled to a field winding of the generator; and
    wherein the processor is programmed to cause variations in the signal output applied to the field winding wherein the variations are made independently of the measured voltage output and measured current and to measure response of the generator to the variations.

11. The system test apparatus of claim 10 wherein each of the plurality of test apparatus comprises a communication module in signal communication with the respective processor, whereby the variations in the applied current are the same for each of the plurality of generators.

12. The system test apparatus of claim 10 wherein the current sensor comprises an inductive sensor, a Hall effect sensor or a shunt sensor.

13. The system test apparatus of claim 10 wherein the voltage sensor comprises a voltage transformer.

14. The test system apparatus of claim 10 wherein the variations are configured to measure power generation system response to at least one of voltage dip ride-through, over voltage, under voltage, over excitation of the field winding, under excitation of the field winding, kilovolt-ampere reactive (kVAR) sharing failure, voltage sensing failure and governor stability protection.

15. The system test apparatus of claim 10 wherein the test apparatus is a stand-alone test device that is selectively coupled between at least one generator and the automatic voltage regulator.

16. A method for testing a power generation system, comprising:
   measuring, using a test device that is separate from at least one generator, current generated by the at least one generator, the at least one generator including a field winding operable to control voltage and/or current generated by the at least one generator by controlling voltage applied to the field winding, an output of the at least one generator connected to a load;
   measuring voltage output by the at least one generator using the test device;
   selectively conducting the measured current and the measured voltage to a processor of the test device connected to the at least one generator;
   causing the processor to vary at least one of output current and the output voltage by generating a field output current and/or voltage, via a field output of the test device;
   selectively conducting the field output of the test device to the field winding of the at least one generator; and
   determining a response of the power generation system to the varied current and/or voltage outputted to the field windings of the least one generator.

17. The method of claim 16 wherein varying at least one of output current and output voltage comprises generating the field output current and/or voltage in a test mode independently of the measured voltage output and measured generated current.

18. The method of claim 16 wherein varying at least one of output current and output voltage enables testing the power generation system response to at least one of voltage dip ride-through, over voltage, under voltage, over excitation of the field winding, under excitation of the field winding, kilovolt-ampere reactive (kVAR) sharing failure, voltage sensing failure and governor stability protection.

19. The method of claim 16 wherein the measuring generated current is performed by an inductive sensor, a Hall effect or a shunt sensor.

* * * * *